United States Patent
Hachida et al.

(10) Patent No.: US 9,448,262 B2
(45) Date of Patent: Sep. 20, 2016

(54) CURRENT SENSOR HAVING AT LEAST ONE CANCEL COIL

(71) Applicant: Ferrotec Corporation, Chuo-ku (JP)

(72) Inventors: Takayuki Hachida, Chuo-ku (JP); Yasutake Hirota, Chuo-ku (JP)

(73) Assignee: Ferrotec Corporation, Tokyo (JP)

( * ) Notice: Subject to any disclaimer, the term of this patent is extended or adjusted under 35 U.S.C. 154(b) by 15 days.

(21) Appl. No.: 14/384,712

(22) PCT Filed: Mar. 12, 2013

(86) PCT No.: PCT/JP2013/056812
§ 371 (c)(1),
(2) Date: Sep. 12, 2014

(87) PCT Pub. No.: WO2013/137253
PCT Pub. Date: Sep. 19, 2013

(65) Prior Publication Data
US 2015/0028857 A1    Jan. 29, 2015

(30) Foreign Application Priority Data

Mar. 12, 2012 (JP) .................. 2012-054623
Mar. 11, 2013 (JP) .................. 2013-048214

(51) Int. Cl.
*G01R 33/02* (2006.01)
*G01R 19/00* (2006.01)
*G01R 15/18* (2006.01)

(52) U.S. Cl.
CPC ......... *G01R 19/0092* (2013.01); *G01R 15/185* (2013.01); *G01R 33/02* (2013.01)

(58) Field of Classification Search
CPC . G01R 15/185; G01R 19/0092; G01R 33/02
USPC ................................. 324/116–126
See application file for complete search history.

(56) References Cited

U.S. PATENT DOCUMENTS

| 4,482,862 A | 11/1984 | Leehey |
| 8,076,932 B2 | 12/2011 | Lenglet |

(Continued)

FOREIGN PATENT DOCUMENTS

| CN | 101305291 A | 11/2008 |
| FR | 2744529 A1 | 8/1997 |

(Continued)

OTHER PUBLICATIONS

PCT International Search Report, PCT/JP2013/056812, Japanese Patent Office, mailed Jun. 18, 2013.
PCT International Preliminary Report on Patentability, Issued Sep. 16, 2014 (translation), PCT/JP2013/056812, Applicant: Ferrotec Corporation.
English translation of Office Action in counterpart Korean patent application, mailed Sep. 18, 2015.

(Continued)

*Primary Examiner* — Jay Patidar
(74) *Attorney, Agent, or Firm* — Robert R. Deleault, Esq.; Mesmer & Deleault, PLLC

(57) ABSTRACT

A current sensor according to the present invention includes a sensor element and a detector. The sensor element includes a core member, an exciting coil and a detection coil. The sensor element is configured such that, while the exciting coil is fed with an excitation signal, comprising a fundamental component, and when the signal to be detected flows, a signal, including a harmonic component, corresponding to the permeability μ of the core member at that point, being superposed on the fundamental component, is outputted from the detection coil. The detector includes a component extraction unit, a level specification unit, and an information output unit.

8 Claims, 8 Drawing Sheets

(56) References Cited

U.S. PATENT DOCUMENTS

| | | | | |
|---|---|---|---|---|
| 2008/0252289 A1* | 10/2008 | Lenglet | ............... | G01R 33/04 324/253 |
| 2012/0038360 A1 | 2/2012 | Lenglet | | |
| 2012/0229238 A1* | 9/2012 | Hirota | ............... | B22F 1/0018 335/297 |

FOREIGN PATENT DOCUMENTS

| | | |
|---|---|---|
| JP | 1010161 A | 1/1998 |
| JP | 2003315374 A | 11/2003 |
| JP | 2009511868 A | 3/2009 |
| JP | 20095118868 A | 3/2009 |
| JP | 2011119661 A | 6/2011 |
| WO | 00/63057 A1 | 10/2000 |

OTHER PUBLICATIONS

English translation of Office Action in counterpart Chinese patent application, No. 201380014063.6 mailed Dec. 3, 2015.

Vourc'h, E. et al., "Analytical and numerical analyses of a current sensor using non linear effects in a flexible magnetic transducer," Progress in Electromagnetic Research, vol. 99, 2000, pp. 323-338.

Velasco-Quesada, Guillermo et al., "Design of a Low-Consumption Fluxgate Transducer for High-Current Measurement Applications," IEEE Sensors Journal, vol. 11, No. 2, Feb. 2011, pp. 280-287.

Yang, Xiaoguang et al., "The optimization of dual-core closed-loop fluxgate technology in precision current sensor," Journal of Applied Physics, 111, 07E722 (2012).

Extended European Search Report, Appl. No. 13760825.3, mail date Nov. 9, 2015.

\* cited by examiner

*ENLARGEMENT OF LOW MAGNETIC FIELD IN (A)

*ENLARGEMENT OF LOW MAGNETIC FIELD IN (C)

CURRENT SENSOR HAVING AT LEAST ONE CANCEL COIL

CROSS-REFERENCE TO RELATED APPLICATIONS

The present international application claims the benefit of Japanese Patent Application No. 2012-054623 filed on Mar. 12, 2012, and Japanese Patent Application No. 2013-048214 filed on Mar. 11, 2013 in Japan Patent Office, and the entire disclosure of the Japanese Patent Applications No. 2012-054623 and No. 2013-048214 is incorporated herein by reference.

TECHNICAL FIELD

The present invention relates to a current sensor that detects a current flowing in a target electric cable.

BACKGROUND ART

Conventionally, in a current sensor that includes an annular core member wound by an excitation coil and a detection coil, a signal level, detected in a detection coil side in which an excitation signal is received, changes due to a signal level of a current to be detected that passes through the annular region of the core member. The current to be detected is generally specified (detected) based on the change (see Patent Document 1).

PRIOR ART DOCUMENT

Patent Document

Patent Document 1: Unexamined Japanese Patent Application Publication No. 10-010161

SUMMARY OF THE INVENTION

Problems to be Solved by the Invention

However, the current sensor with the above-described structure is configured such that the core member is saturated with the current to be detected up to in the vicinity of a saturation magnetization density Bs, and a magnetic flux B, generated by the exciting signal in the form of a sine wave, is distorted so that the signal level corresponding to the change is specified as the signal level of the current to be detected. Therefore, detection is possible only within a narrow current range, which corresponds to the vicinity of the saturation magnetization density Bs.

Moreover, in order to improve the signal level of the current to be detected to an extent that the core member can be saturated, the electric cable, in which the signal to be detected passes through, needs to be wound around the core member a number of times. As a result, the current sensor tends to become complicated and large-scaled, which limits the application of the sensor.

The present invention preferably provides a current sensor that can detect electric current in a wider range as compared with conventional sensors.

Means for Solving the Problems

A first aspect of the present invention provides a current sensor including a sensor element and a detector. The sensor element includes: a core member, annularly formed with a magnetic material, and having characteristics such that, corresponding to an external magnetic field that changes due to influence of a signal to be detected that passes through a detection area surrounded by the annularity, a permeability $\mu$ decreases from an vertex where the external magnetic field is 0, and such that the curvature of a curve, exhibited when a change in the permeability $\mu$ is plotted in "a coordinate system defined by the external magnetic field—the permeability $\mu$", becomes larger corresponding to absolute values of the external magnetic field; an exciting coil wound around the core member so as to excite the core member; and a detection coil wound around the core member and used so as to detect the signal to be detected. The sensor element is configured such that, while the exciting coil is fed with an excitation signal, comprising a fundamental component, and when the signal to be detected flows, a signal, including a harmonic component, corresponding to the permeability $\mu$ of the core member at that point, being superposed on the fundamental component, is outputted from the detection coil.

The detector includes: a component extraction unit that extracts, from the output signal of the detection coil, the harmonic component superposed on the fundamental component among signal components included in the output signal; a level specification unit that specifies a signal level corresponding to the harmonic component, extracted by the component extraction unit, as the signal level of the signal to be detected at that point based on a corresponding relationship between the harmonic component, potentially included in the output signals, and the signal level of the signal to be detected when the harmonic component is generated; and an information output unit that outputs information externally, indicating the signal level specified by the level specification unit.

According to the current sensor in this aspect, the core member is provided with such characteristics that, although a magnetic flux corresponding to the signal level of the signal to be detected is generated in a superposed manner, due to the characteristics of the core member itself, the permeability decreases from the vertex where the external magnetic field H=0, whereas the curvature of the $\mu$-H curve, defined by the external magnetic field H and the permeability $\mu$, becomes larger corresponding to magnitudes of absolute values of the external magnetic field H.

In these characteristics, as seen in a $\mu$-H coordinate where the magnetic field H is shown on the x-axis and the permeability $\mu$ as a differential value of magnetization M is shown on the y-axis, at an arbitrary position on a quadratic curve, the amplitude of the exciting signal changes along the x-axis, whereas the amplitude of the output signal from the detection coil changes along the y-axis, on which the harmonic component according to "the degree of curvature" on the quadratic curve is superposed. Since the center of the amplitude of the exciting signal is located on the quadratic curve, an inherent harmonic component according to the magnetic field H is superposed on the output signal in a wide range from in the vicinity of the magnetic field H=0 to in the vicinity of the magnetic field Hs corresponding to the saturation magnetization.

That is to say, in the above-described structure, the signal level of the signal to be detected can be specified (detected) not only in an extremely narrow range in the vicinity of the magnetic field Hs corresponding to the saturation magnetization, but also in a wide range from in the vicinity of the magnetic field H=0 to in the vicinity of the magnetic field Hs.

Moreover, since this structure enables detection of current values ranging from a small current value, corresponding to in the vicinity of the magnetic field H=0, to a large current value, corresponding to in the vicinity of the magnetic field Hs, the electric cable does not need to be wound around the core member a number of times in order to improve the signal level of the current to be detected. As a result, the current sensor can be simplified and downsized, which widens the application of the sensor.

In the above-described aspect, a specific structure so as to extract the harmonic component from the detection signal is not particularly limited. The structures according to a second to fourth aspects, which will be described below, may be employed.

In a second aspect, the core member in the sensor element includes a first and a second core member, each disposed along a direction penetrating the detection area. Two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. Two of the detection coils in the sensor element are wound around the first and the second core member respectively and connected in series, a number of windings and a positional relationship thereof are determined such that a signal flowing in one of the detection coils and a signal flowing in another have opposite phases and equivalent signal levels. The component extraction unit in the detector extracts the output signal itself from the two of the detection coils connected in series as the harmonic component.

In this aspect, the exciting coils are respectively connected in series so as to have opposite phases whereas the detection coils are respectively connected in series so as to have coordinate phases. Thus, the fundamental component (a signal component of an alternating current, such as a sine wave; the same shall apply hereafter), regularly increasing and decreasing from a flux generated by exciting signals, is canceled out, while the harmonic component, irregularly increasing and decreasing in the form of distortion, is outputted in an enhanced manner.

Therefore, by extracting the output signal itself from the pair of detection coils connected in series as the harmonic component, the signal level of the signal to be detected can be specified.

In a third aspect, the core member in the sensor element includes a first and a second core member, each disposed along a direction penetrating the detection area. Two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. The detection coil in the sensor element is configured to be a single coil wound around the first and the second core member in a combined manner. The component extraction unit in the detector extracts the output signal itself from the two of the detection coils as the harmonic component.

In this aspect, the exciting coils are respectively connected in series so as to have opposite phases, while the detection coil is wound around the first and the second core member in the combined manner to configure a single core member including the first and the second core member. Thus, the fundamental component, regularly increasing and decreasing from the flux generated by exciting signals, is canceled out, while the harmonic component, irregularly increasing and decreasing in the form of distortion, is outputted in an enhanced manner.

As a result, by extracting the output signal itself from the pair of detection coils connected in series as the harmonic component, the signal level of the signal to be detected can be specified.

In a fourth aspect, the sensor element includes a displacement generation unit that produces a displacement signal based on the output signal from the detection coil. The displacement signal is produced by shifting a phase of the output signal by a ½ cycle. The component extraction unit in the detector extracts a signal, generated by combining the output signal from the detection coil and the displacement signal produced by the displacement generation unit, as the harmonic component.

In this aspect, by canceling out the output signal itself and the displacement signal produced by shifting the phase of the output signal by a ½ cycle, the fundamental component, regularly increasing and decreasing, is removed from the signal component of the output signal, while a signal in which the harmonic component, irregularly increasing and decreasing in the form of distortion, is extracted.

As a result, by extracting the signal in which the harmonic component is enhanced, the signal level of the signal to be detected can be specified.

In the above-described second to fourth aspects, since the harmonic component is outputted in the enhanced manner, based on the enhanced harmonic component, a corresponding relationship between the harmonic component and the signal level of the signal to be detected needs to be prepared.

In each of the aspects described above, the permeability $\mu$ in the core member fluctuates in some cases not only due to the influence of the external magnetic field but also due to influence of a temperature environment. Therefore, in order to suppress unintentional fluctuation in the harmonic component corresponding to such fluctuation in the permeability and to improve accuracy of the current sensor with the present structure, the current sensor needs to be preferably insusceptible of the influence of the temperature environment.

For example, in the light of the fact that the influence of the temperature environment is caused by the permeability $\mu$, a possible prevention is to avoid the influence of the permeability $\mu$. A specific structure for the prevention may be, for example, to adopt a structure according to a fifth aspect, which will be described below.

In a fifth aspect, the sensor element includes a cancel coil wound around the core member and fed with a cancel signal so as to cancel out the change in the external magnetic field due to the influence of the signal to be detected. The sensor element is configured such that the change in the external magnetic field due to the influence of the cancel signal, fed to the cancel coil, causes a change in the harmonic component superposed on the output signal from the detection coil.

The detector includes a cancel control unit that controls feeding of the cancel signal to the cancel coil. The cancel control unit performs feedback control of the signal level of the cancel signal so that the harmonic component, extracted by the component extraction unit, becomes small. The level specification unit specifies the signal level in such a manner that, once the feedback control by the cancel control unit is initiated and when it is determined that the harmonic component, extracted by the component extraction unit, is smaller than a predetermined threshold, based on a corresponding relationship between the harmonic component canceled out according to the signal level of the cancel signal and the signal level of the signal to be detected when the harmonic component is generated, the level specification unit specifies the signal level corresponding to the signal level of the cancel signal that initially makes the harmonic component smaller than the threshold as the signal level of the signal to be detected at that point.

In this aspect, the change in the external magnetic field, which is caused by the signal to be detected, is canceled by the feedback control of the cancel signal, and the signal level of the signal to be detected is specified based on the signal component of the cancel signal used for the cancellation.

The cancel signal is outputted from the cancel coil wound around the same core member as where the detection coil is wound around, and influenced by the same external magnetic field and temperature environment as what influences output signal from the detection coil. Therefore, canceling the change in the external magnetic field, which is caused due to the signal to be detected, by changing the signal level of the cancel signal means that the signal level corresponding to the signal level of the signal to be detected is reproduced by the cancel signal. This further indicates that the signal level of the cancel signal corresponds to the signal level of the signal to be detected.

By canceling the change in the external magnetic field, which is caused by the signal to be detected, with the canceling signal, the signal level of the cancel signal, used for canceling the change in the external magnetic field, can be handled as a signal component from which the influence of the permeability $\mu$ and the temperature environment are excluded, and as a signal component corresponding to the signal to be detected.

As a result, canceling the change in the external magnetic field, which is caused by the signal to be detected, by feedback control of the cancel signal contributes to specify the signal level of the signal to be detected based on the signal component of the cancel signal used for the cancellation.

In the fifth aspect, if the core member includes a first and a second core member each disposed along a direction penetrating the detection area in a similar manner as in the aspects described above, the cancel coil may be wound around the core member in such manners according to sixth to ninth aspects, which will be described below.

In a sixth aspect, two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. Two of the detection coils in the sensor element are wound around the first and the second core member respectively and connected in series, and a number of windings and a positional relationship thereof are determined such that a signal flowing in one of the detection coils and a signal flowing in another have coordinate phases and equivalent signal levels.

On the other hand, the component extraction unit in the detector extracts the output signal itself from the two of the detection coils connected in series as the harmonic component. Two of the cancel coils in the sensor element are wound around the first and the second core member respectively and connected in series, and a number of windings and a positional relationship thereof are determined such that a signal flowing in one of the cancel coils and a signal flowing in another have coordinate phases and equivalent signal levels.

In a seventh aspect, two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. Two of the detection coils in the sensor element are wound around the first and the second core member respectively and connected in series, and a number of windings and a positional relationship thereof are determined such that a signal flowing in one of the detection coils and a signal flowing in another have coordinate phases and equivalent signal levels. The component extraction unit in the detector extracts the output signal itself from the two of the detection coils connected in series as a harmonic component. The cancel coil in the sensor element is configured to be a single coil wound around the first and the second core member in the combined manner.

In a eighth aspect, two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. The detection coil in the sensor element is configured to be a single coil wound around the first and the second core member in the combined manner. The component extraction unit in the detector extracts the output signal itself from the two of the detection coils connected in series as the harmonic component. Two of the cancel coils in the sensor element are wound around the first and the second core member respectively and connected in series, and a number of windings and a positional relationship thereof are determined such that a signal flowing in one of the cancel coils and a signal flowing in another have coordinate phases and equivalent signal levels.

In a ninth aspect, two of the exciting coils in the sensor element are wound around the first and the second core member respectively and connected in series, and a number of windings and a positional relationship thereof are determined such that a signal flowing in one of the exciting coils and a signal flowing in another have opposite phases and equivalent signal levels. The detection coil is configured to be a single coil wound around the first and the second core member in the combined manner. The component extraction unit in the detector extracts the output signal itself from the two of the detection coils connected in series as the harmonic component. The cancel coil in the sensor element is configured to be a single coil wound around the first and the second core member in the combined manner.

In these aspects, the external magnetic field can be changed with the cancel signal through each of the first and second core member.

A sensor element according to a tenth aspect, provided so as to solve the above-described problems, includes: a core member, annularly formed with a magnetic material, and having characteristics such that, corresponding to an external magnetic field that changes due to influence of a signal to be detected that passes through a detection area surrounded by the annularity, a permeability $\mu$ decreases from an vertex where the external magnetic field is 0, and such that curvature of a curve, exhibited when a change in the permeability $\mu$ is plotted in "a coordinate system defined by the external magnetic field—the permeability $\mu$", becomes larger corresponding to absolute values of the external magnetic field; an exciting coil wound around the core member so as to excite the core member; and a detection coil wound around the core member and used so as to detect the signal to be detected. The sensor element is configured such that, while the exciting coil is fed with an excitation signal, comprising a fundamental component, and when the signal to be detected flows, a signal, including a harmonic component, corresponding to the permeability μ of the core member at that point, being superposed on the fundamental component, is outputted from the detection coil.

This sensor element can comprise one part of the current sensor according to one of the above-described aspects.

Among these phases, an eleventh aspect (claim 11) may be adopted in which the sensor element includes a cancel coil wound around the core member and fed with a cancel signal so as to cancel out the change in the external magnetic field due to the influence of the signal to be detected, and in which the sensor element is configured such that the change in the external magnetic field due to the influence of the cancel signal, fed to the cancel coil, causes a change in the harmonic component superposed on an output signal from the detection coil.

A control device according to a twelfth aspect provided so as to solve the above-described problems is connected to the sensor element having a structure according to one of the first to the ninth aspects described above. The control device includes: a component extraction unit that extracts, from an output signal of the detection coil, the harmonic component superposed on the fundamental component among signal components included in the output signal; a level specification unit that specifies a signal level corresponding to the harmonic component, extracted by the component extraction unit, as the signal level of the signal to be detected at that point based on a relationship between the harmonic component, potentially included in the output signal, and the signal level of the signal to be detected when the harmonic component is generated; and an information output unit that outputs information externally, indicating the signal level specified by the level specification unit.

This sensor element can comprise one part of the current sensor according to one of the first to the ninth aspects described above.

Among these aspects, a structure described in a thirteenth aspect may be employed if the sensor element includes a cancel coil wound around the core member, and fed with a cancel signal so as to cancel out the change in the external magnetic field due to the influence of the signal to be detected, and if the sensor element is configured such that the change in the external magnetic field due to the influence of the cancel signal, fed to the cancel coil, causes a change in the harmonic component superposed on an output signal from the detection coil.

In the thirteenth aspect, a cancel control unit that controls feeding of a cancel signal to the cancel coil is included. The cancel control unit performs feedback control of the signal level of the cancel signal so that the harmonic component, extracted by the component extraction unit, becomes small. The level specification unit specifies the signal level in such a manner that, once the feedback control by the cancel control unit is initiated and when it is determined that the harmonic component, extracted by the component extraction unit, is smaller than a predetermined threshold, based on a corresponding relationship between the harmonic component canceled out according to the signal level of the cancel signal and the signal level of the signal to be detected when the harmonic component is generated, the level specification unit specifies the signal level corresponding to the signal level of the cancel signal that initially makes the harmonic component smaller than the threshold as the signal level of the signal to be detected at that point.

BRIEF DESCRIPTION OF THE DRAWINGS

FIGS. 2A-2D are graphs in which: FIG. 2A shows characteristics that a core member has (M-H curve defined by a change in magnetization M with respect to an external magnetic field H); FIG. 2B shows characteristics that the core member has (M-H curve defined by the change in the magnetization M with respect to the external magnetic field H; the low magnetic field region in FIG. 2A is enlarged); FIG. 2C shows characteristics that the core member has (μ-H curve defined by the external magnetic field H and permeability μ); and FIG. 2D shows characteristics that the core member has (μ-H curvature defined by the external magnetic field H and permeability μ; the low magnetic field region in FIG. 2C is enlarged);

EXPLANATION OF REFERENCE NUMERALS

1 . . . current sensor, 2 . . . sensor element, 3 . . . detector, 21 . . . core member, 23 . . . exciting coil, 25 . . . detection coil, 31 . . . component extraction unit, 33 . . . level specification unit, 35 . . . information output unit, 37 . . . signal source, 39 . . . displacement generation unit, 51 . . . cancel coil, 60 . . . cancel control unit, 61 . . . comparator, 63 . . . integrator, 65 . . . level calculator, 67 . . . level control circuit, 100 . . . electric cable to be detected

MODE FOR CARRYING OUT THE INVENTION

The following describes embodiments according to the present invention with reference to the drawings.

(1) First Embodiment

Figure 1:
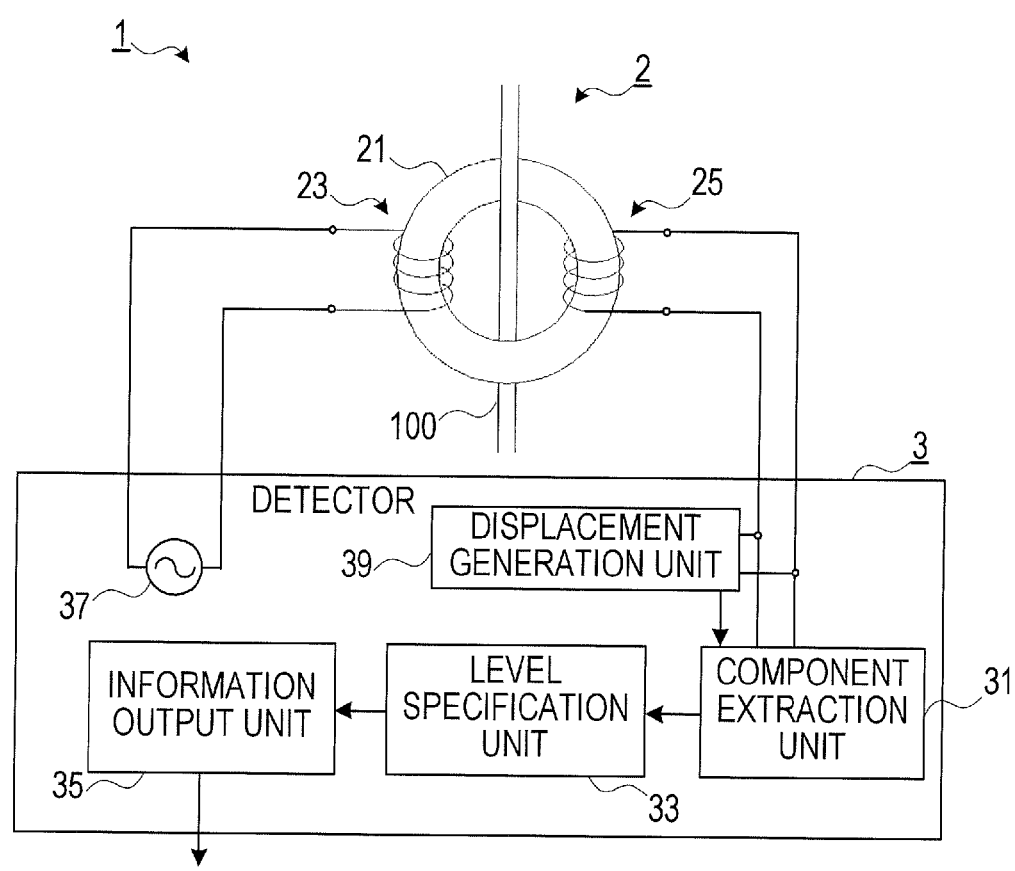
FIG. 1 is a block diagram showing an entire structure of a current sensor according to a first embodiment.

A current sensor 1 according to the present embodiment includes, as shown in FIG. 1, a sensor element 2 and a detector 3.

The sensor element 2 includes: a core member 21, annularly formed with a magnetic material; an exciting coil 23 wound around the core member 21 and exciting the core member 21; and a detection coil 25 wound around the core member 21 and used so as to detect a signal to be detected.

Figure 2A:
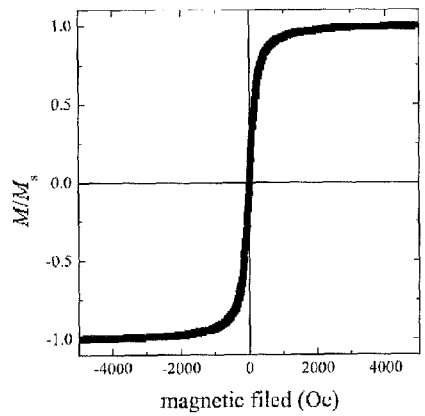
Figure 2B:
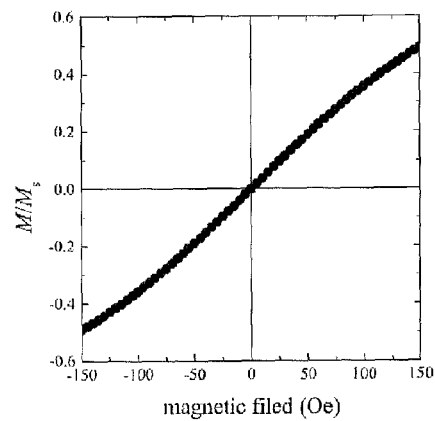

Among these components, the core member 21 allows an electric cable to be detected 100 to pass through a detection area surrounded by the annularity, and is made of a member having such characteristics that, when the signal to be detected is fed in the electric cable to be detected 100, corresponding to an external magnetic field that changes due to the influence of the signal to be detected, permeability μ decreases from the vertex where the external magnetic field is 0. It is to be noted that permeability μ is a value expressed based on a slope of an M-H curve (see FIG. 2A, FIG. 2B) defined by a change in magnetization M with respect to the external magnetic field H (that is, a differential value of the magnetization M according to the external magnetic field H) as in Mathematical Formula 1 shown below.

Figure 2C:
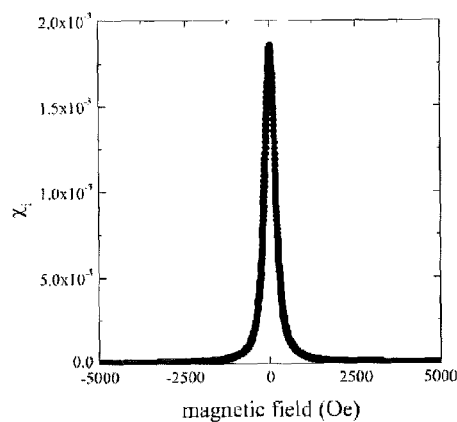
Figure 2D:
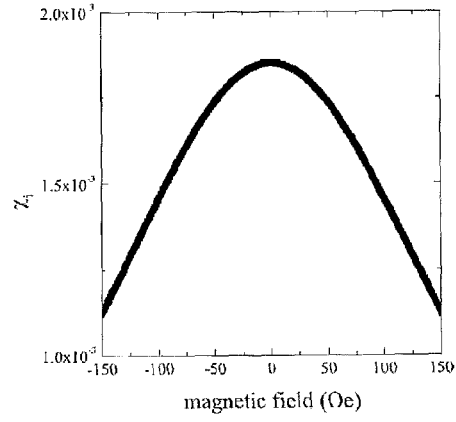

[Mathematical Formula 1]

$$\chi_i = \frac{dM}{dH} = \frac{\mu}{k'T} Ms * A$$ (Mathematical Formula 1)

k': A value obtained by multiplying an arbitrary coefficient with Boltzmann constant
T: Absolute temperature
Ms: Saturation magnetization
A: Coefficient For such a magnetic material, the magnetic material described in Japanese Patent Application No. 2010-215871 filed by the applicant of the present application may be considered as one example. This magnetic material has characteristic, as shown in FIG. 2C and FIG. 2D, in which the permeability decreases from the vertex where the external magnetic field H=0, whereas the curvature of the μ-H curve, defined by the external magnetic field H and the permeability μ, becomes larger corresponding to the magnitudes of the absolute values of the external magnetic field H.

The sensor element 2 is configured such that, while an excitation signal, comprising a fundamental component, is fed to the exciting coil 23, and when the signal to be detected flows in the electric cable to be detected 100, a signal, including a harmonic component, corresponding to the permeability μ of the core member 21 at that point, being superposed on the fundamental component, is outputted from the detection coil 25.

Meanwhile, the detector 3 serves as a control device that inputs and outputs various signals in order to specify the signal level of the signal to be detected based on the output signal from (the detection coil 25 of) the sensor element 2. The detector 3 includes: a component extraction unit 31 that extracts the harmonic component superposed on the fundamental component among signal components included in the signals outputted from the detection coil 25; a level specification unit 33 that specifies a signal level corresponding to the harmonic component extracted by the component extraction unit 31 as the signal level of the signal to be detected at that point; an information output unit 35 that outputs information externally, indicating the signal level specified by the level specification unit 33; and a signal source 37 that feeds the exciting coil 23.

Among these components, the level specification unit 33 specifies the signal level of the signal to be detected based on a corresponding relationship between the harmonic component potentially included in the output signal and the signal level of the signal to be detected when this harmonic component is generated.

The value of the signal level of the current to be detected, which is obtained according to the harmonic component, actually differs depending on the positional relationship between the core member 10 and the electric cable to be detected 100 (defined by Ampere's rule, Biot-Savart low, and so on). Therefore, a value defined by the positional relationship of these components is used.

The signal source 37 feeds the exciting coil 23 with an alternating current signal (sine wave signal in the present embodiment). The alternating current component of this signal becomes the fundamental component through the core member 21 and is detected by the detection coil 25.

The detector 3 includes a displacement generation unit 39 that generates a displacement signal based on the output signal from the detection coil 25. The displacement signal is produced by shifting the phase of the output signal by a ½ cycle. The component extraction unit 31 extracts a signal, generated by combining the output signal from the detection coil 25 and the displacement signal produced by the displacement generation unit 39, as the harmonic component.

The displacement generation unit 39 may be configured so as to, for example, convert the output signal into a digital signal and generate a displacement signal by data processing, or so as to generate a displacement signal shifted by a ½ cycle with a delay circuit.

(2) Second Embodiment

Figure 3:
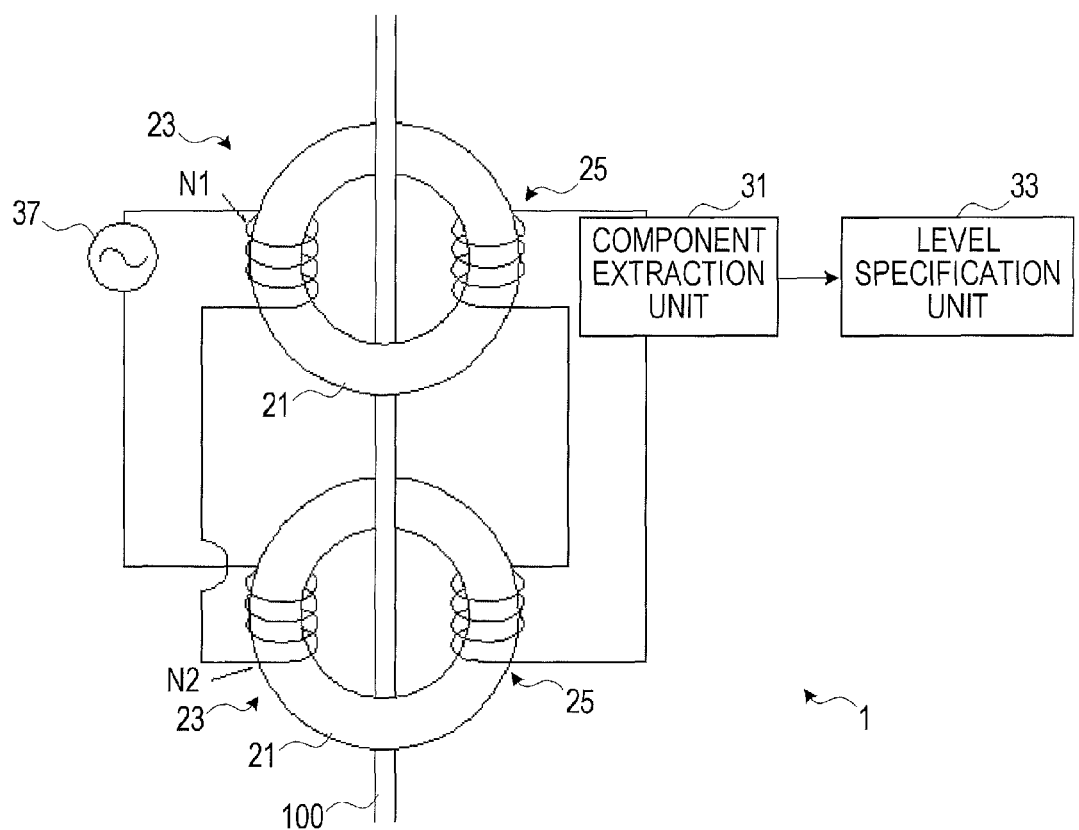
FIG. 3 is a block diagram showing an entire structure of a current sensor according to a second embodiment.

As shown in FIG. 3, the current sensor 1 according to the present embodiment is different from the first embodiment in that two core members 21 are provided and disposed such that the single electric cable to be detected 100 passes through each detection area, and the core members 21 are each wound by the exciting coil 23 and the detection coil 25, and in that the displacement generation unit 39 is not provided.

In this configuration, the exciting coils 23 are respectively connected in series, and have specific number of windings and positional relationship so that the signal flowing in one of the exciting coils 23 and the signal flowing in the other exciting coil 23 have opposite phases and equivalent signal levels.

The detection coils 25 are respectively connected in series, and have a specific number of windings and positional relationship so that the signal flowing in one of the detection coils 25 and the signal flowing in the other detection coil 25 have coordinate phases and equivalent signals levels.

The component extraction unit 31 of the detector 3 is configured so as to extract the output signal itself from the detection coils 25 connected in series as the harmonic component.

Figure 4:
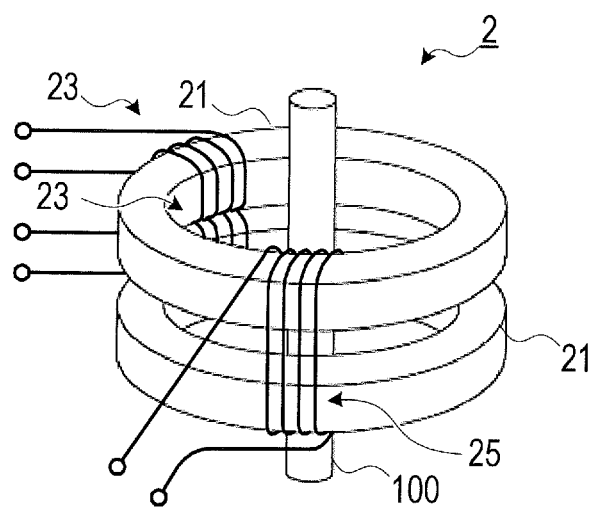
FIG. 4 is a perspective view showing a sensor element according to another embodiment.

In this embodiment, the detection coil 25 may be wound around, as shown in FIG. 4, a single core member including a first and a second core member 21, so as to be wound around the first and the second core member 21 in the combined manner.

(3) Third Embodiment

Figure 5:
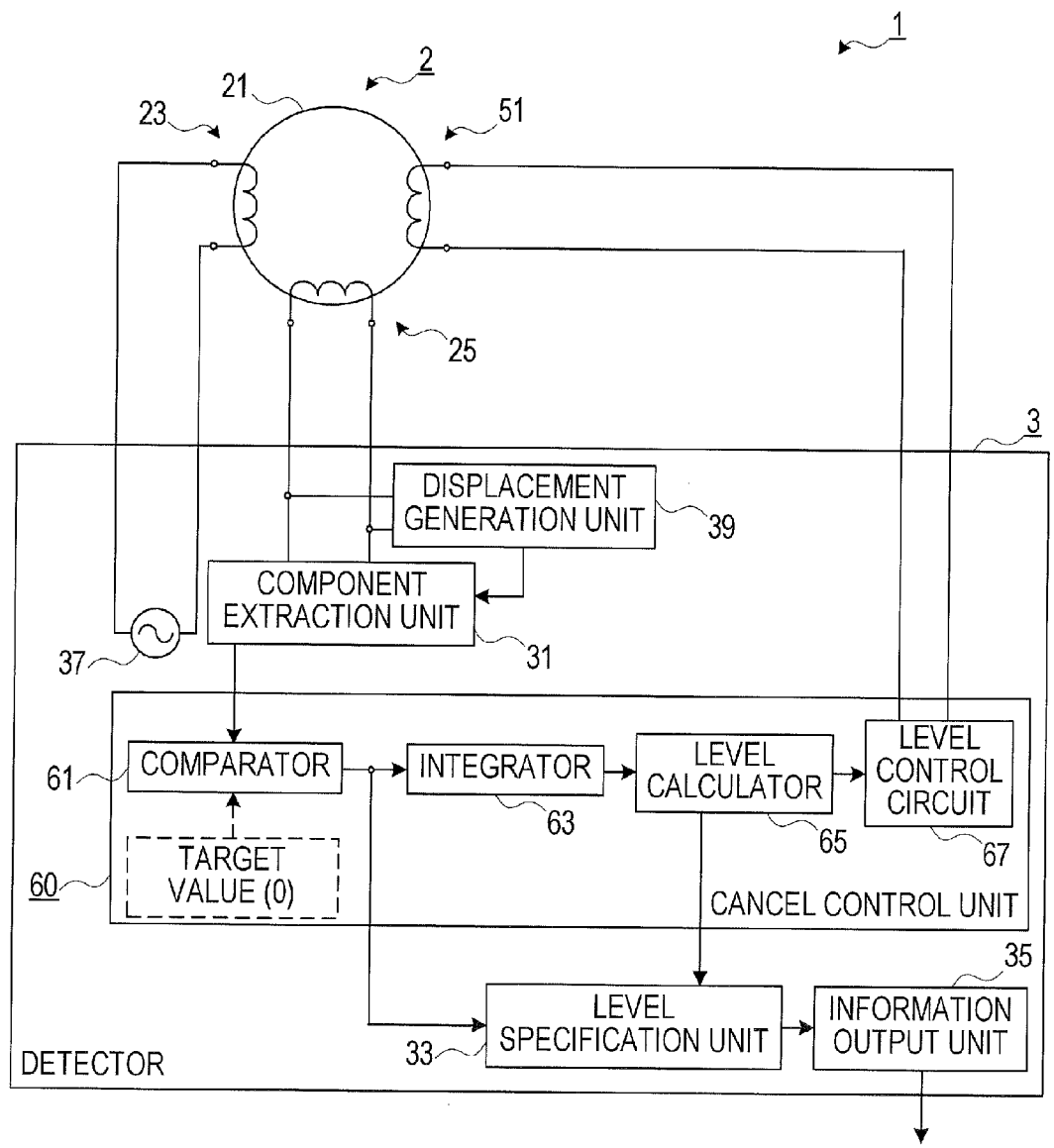
FIG. 5 is a block diagram showing an entire structure of a current sensor according to a third embodiment.

The current sensor 1 according to the present embodiment is different from other embodiments in that, as shown in FIG. 5, a cancel coil 51 is wound around the sensor element 2, and in that a cancel control unit 60 is provided to the detector 3. The differences will be mainly described in detail.

The cancel coil 51 in the sensor element 2 is wound around the core member 21, and a cancel signal is fed thereto so as to cancel out the change in the external magnetic field caused due to the influence of the signal to be detected.

The sensor element 2 is configured such that the change in the external magnetic field due to the influence of the cancel signal, fed to the cancel coil 51, causes a change in the harmonic component, superposed on the signal outputted from the detection coil 25.

The cancel control unit 60 of the detector 3 controls the feeding of the cancel signal to the cancel coil 51, and is configured so as to perform feedback control of a signal level of the cancel signal so that the harmonic component, extracted by the component extraction unit 31, becomes small.

The cancel control unit 60 includes: a comparator 61 that compares (the signal level of) the harmonic component, detected by the component extraction unit 31, with a target value prestored in a memory ("0" in the present embodiment), and outputs the deviation; an integrator 63 that integrates the deviation, outputted by the comparator 61, and outputs the integrated value; a level calculator 65 that calculates the signal level of the cancel signal based on the integrated value outputted by the integrator 63; and a level control circuit 67 that feeds the cancel signal to the cancel coil 51, and controls the signal level according to the calculation result obtained by the level calculator 65.

Among these components, the level calculator 65 calculates the signal level of the cancel signal, in which a constant value is increased/decreased to/from a previous signal level of the cancel signal depending on whether the integrated value outputted from the integrator 63 is positive or negative. Alternatively, the level calculator 65 may be configured so as to directly calculate the signal level of the cancel signal, which is necessary to make the integrated value, outputted from the integrator 63, "0".

Moreover, in this configuration, the level specification unit 33 of the detector 3 checks the output from the comparator 61 of the cancel control unit 60. When it is determined that the deviation outputted to the comparator 61 is smaller than a predetermined threshold (for example, "0"), that is, when it is determined that the harmonic component matches the target value, the level specification unit 33 obtains the signal level of the cancel signal that initially makes the harmonic component smaller than the target value from the level calculator 65 and, based on the obtained signal level, the level specification unit 33 specifies the signal level of the signal to be detected at that point.

Specifically, based on the corresponding relationship (defined with a data table or calculation formula) between the aforementioned harmonic component to be canceled out according to the signal level of the cancel signals and the signal level of the detected signal that is specified when the harmonic component is generated, the signal level, corresponding to the signal level of the cancel signal that initially makes the harmonic component smaller than the threshold, is specified as the signal level of the signal to be detected at that point.

In the present embodiment, "the signal level of the cancel signal that initially makes the harmonic component smaller than the threshold" is obtained in such a manner that, prior to the calculation performed by the level calculator 65 based on the integrated value "0" outputted from the calculator 63, the level specification unit 33 checks the calculation value of the level calculator 65 and obtains this calculation value as the signal level. Alternatively, the configuration may be such that the calculation values obtained by the level calculator 65 are simply stored in time series so that the calculation value, used in the calculation in which the harmonic component becomes smaller than the threshold, is obtained as the signal level.

In the present embodiment, the process and the calculation performed by the detector 3 (components thereof except for the component extraction unit 31, the signal source 37, the level control circuit 67, and the information output unit 35) are constructed so as to be achieved by hardware configuration. However, these process and the calculation may be achieved with a software program and a microcomputer that executes the program.

Figure 6:
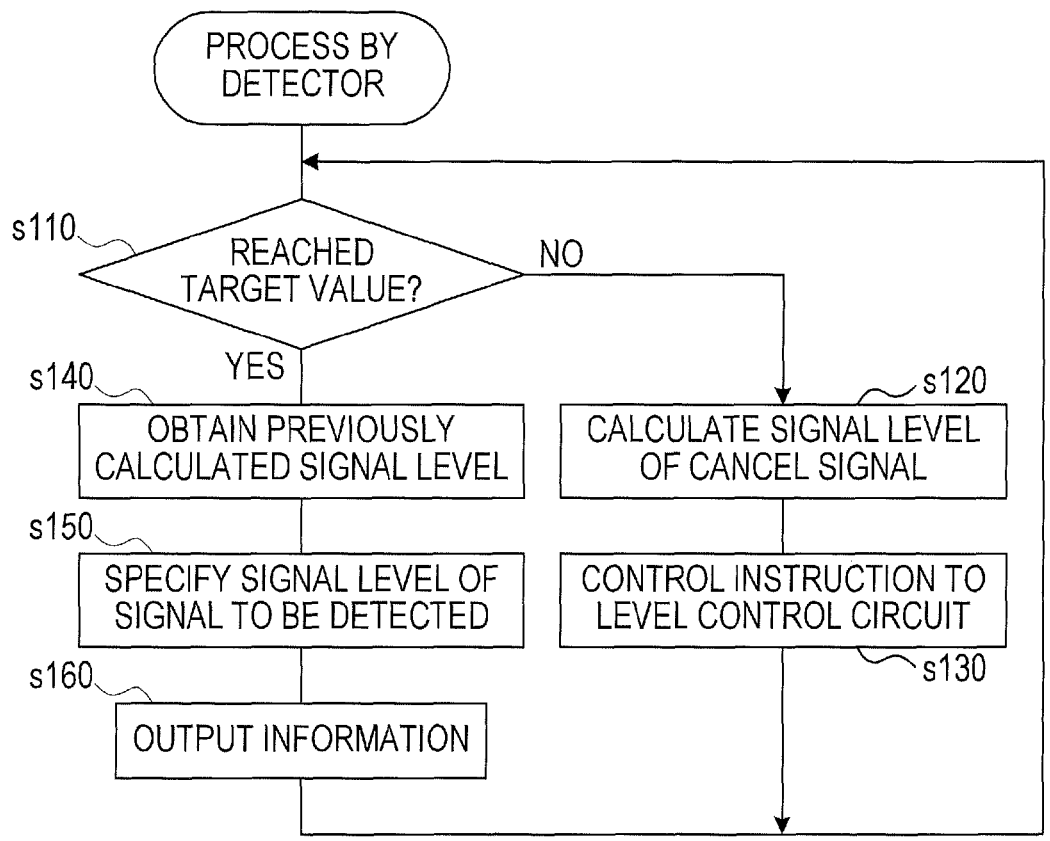
FIG. 6 is a flowchart showing a process performed in the structure according to the third embodiment.

Specifically, a software program, which will be explained below, may be executed by the detector 3 having a function as a microcomputer (see FIG. 6). This program may be prestored in a memory of the detector 3, but may alternatively be recorded in a recording medium of various types and provided to users, or may be delivered through a network to users of the current sensor 1.

First, the detector 3 checks whether or not the output value from the component extraction unit 31 has reached the target value (a value around the target value that is smaller than the threshold) since the initiation of the operation (s110). If it is determined that the output value has not reached the target value (s110:NO), the detector 3 performs calculations in the same manner as the level calculator 65 based on the target value (s120) and provides a control instruction to the level control circuit 67 based on the calculated value (s130). The detector 3 repeats these steps.

When it is determined that the output value has reached the target value (s110:YES), the calculation value, acquired in s120 before the output value has reached the target value, is obtained (s140), based on the calculation value obtained in this manner, the detector 3 specifies a corresponding signal level in the same manner as the level specification unit 33 (s150), and outputs the information of the specified signal level externally (s160). Subsequently, the process returns to s110, and s110 to s160 are repeatedly executed.

(4) Fourth Embodiment

Figure 7:
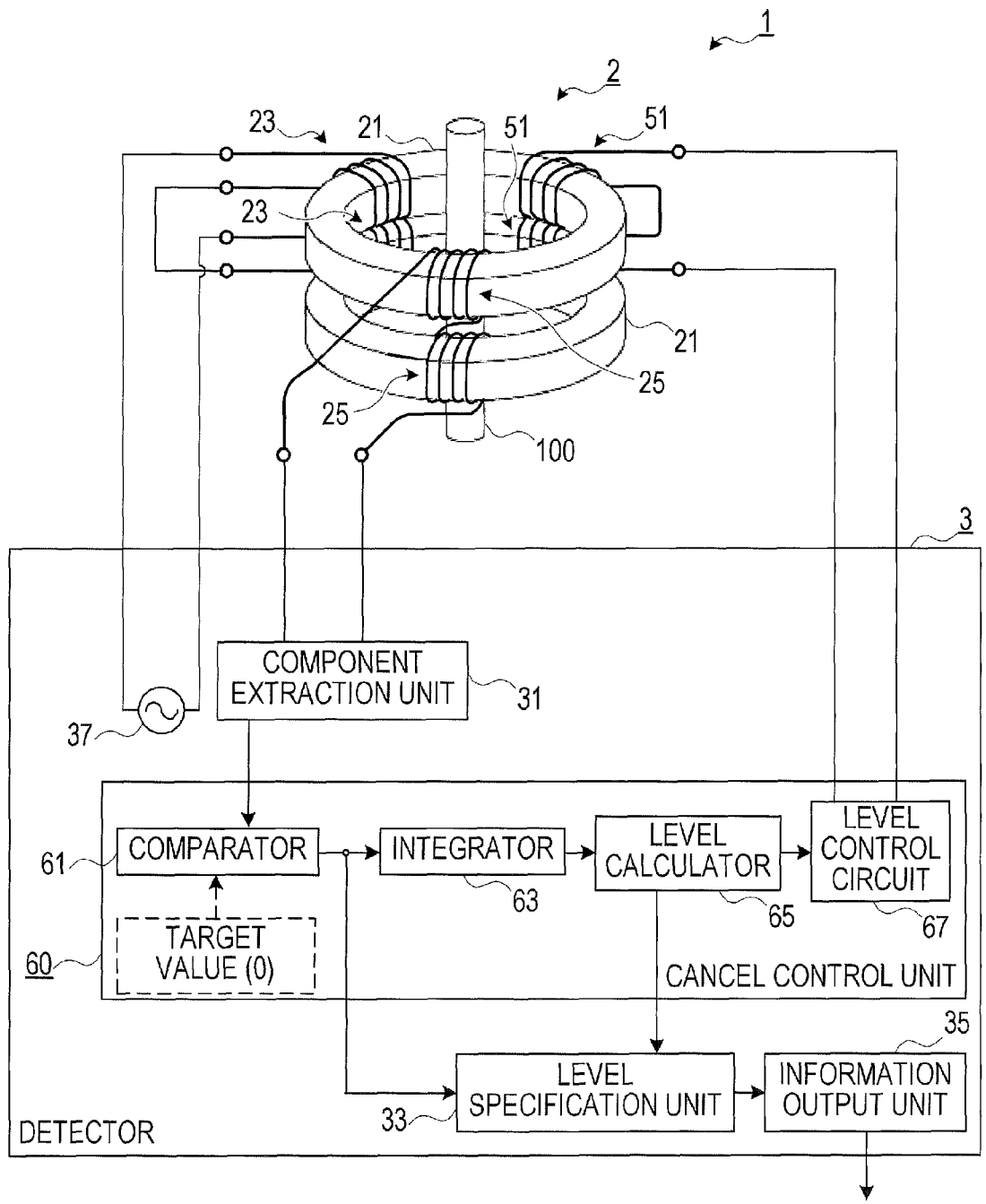
FIG. 7 is a block diagram showing an entire structure of a current sensor according to a fourth embodiment.

The current sensor 1 according to the present embodiment is different from the third embodiment mainly in that, as shown in FIG. 7, the core member comprises a first and a second core member 21 each disposed along a direction penetrating the detection area, and in that the displacement generation unit 39 is not provided. These differences will be mainly explained.

The sensor element 2 includes two exciting coils 23 respectively wound around the first and the second core member 21 and connected in series, and the number of windings and the positional relationship thereof are determined so that the signal flowing in one of the exciting coils 23 and the signal flowing in the other have opposite phases and equivalent signal levels.

Two detection coils 25 are respectively wound around the first and the second core member 21 and connected in series, and the number of windings and the positional relationship thereof are determined so that the signals flowing in one of the detection coils 25 and the signals flowing in the other have coordinate phases and equivalent signal levels.

Two cancel coils 51 are respectively wound around the first and the second core member 21 and connected in series, and the number of windings and the positional relationship thereof are determined so that the signals flowing in one of the cancel coils 51 and the signals flowing in the other have coordinate phases and equivalent signal levels.

In the detector 3, the component extraction unit 31 is configured so as to extract the output signal itself from the detection coils 25 connected in series as the harmonic component.

Figure 8A:
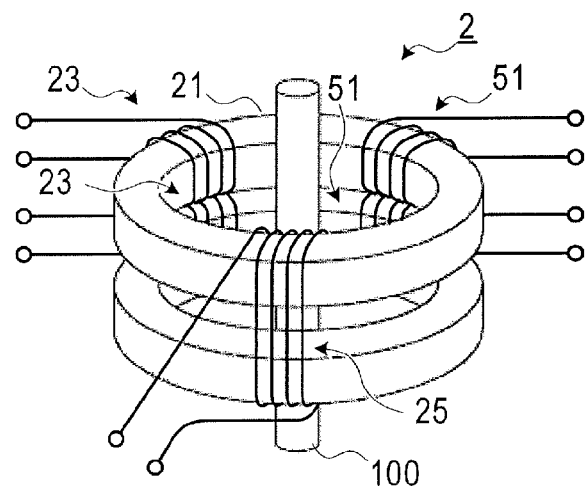
FIGS. 8A-8C are perspective views respectively showing sensor elements according to other embodiments.

In the present embodiment, the detection coil 25 may be, as shown in FIG. 8A, wound around the first and the second core member 21 in the combined manner to configure a single core member including the first and the second core member 21.

Figure 8B:
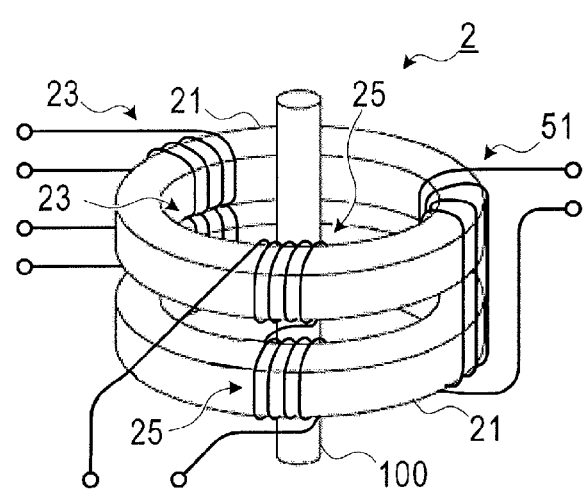
Figure 8C:
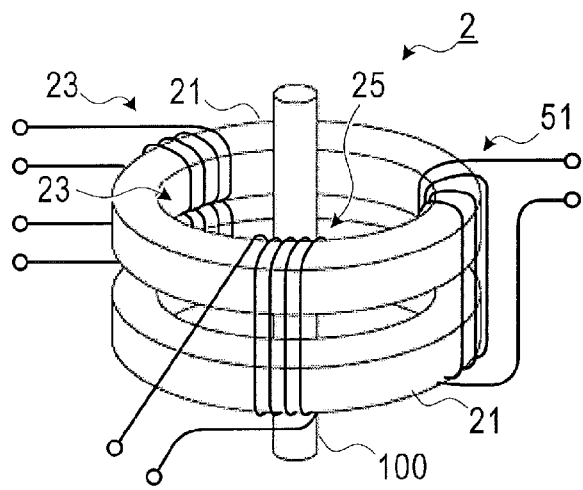

Moreover, the cancel coil 51 may be, as shown in FIG. 8B, wound around the first and the second core member 21 in the combined manner to configure a single core member including the first and the second core member 21. In this case, the detection coil 25 may also be, as shown in FIG. 8C, wound around the first and the second core member 21 in the combined manner.

(3) Effect

According to the current sensor 1 configured as above, although a magnetic flux is generated around the core member(s) 21 in a superposed manner corresponding to the signal level of the signal to be detected, depending on the characteristics of the core member 21 themselves, the permeability μ decreases from the vertex where the external magnetic field H=0, whereas the curvature of the μ-H curve defined by the external magnetic field H and the permeability μ becomes larger corresponding to the magnitudes of the absolute values of the external magnetic field H. Therefore, with reference to the μ-H characteristics, where the magnetic field H is shown on the x-axis and the permeability μ is shown on the y-axis, such characteristics are exhibited in that the permeability μ changes in the form of a quadratic curve corresponding to the external magnetic field H.

With these characteristics, at an arbitrary position on the quadratic curve, the amplitude of exciting signal changes along the x-axis, whereas the amplitude of output signals from the detection coil 25 changes along the y-axis, on which the harmonic component according to "the degree of curvature" of the quadratic curve is superposed. Since the center of the amplitude of the exciting signal is located on the quadratic curve, an inherent harmonic component according to the magnetic field H is superposed on the output signal in a wide range from in the vicinity of the magnetic field H=0 to in the vicinity of the magnetic field Hs corresponding to the saturation magnetization.

That is to say, in the above-described structure, the signal level of the signal to be detected can be specified (detected) not only in an extremely narrow range in the vicinity of the magnetic field Hs corresponding to the saturation magnetization, but also in a wide range from in the vicinity of the magnetic field H=0 to in the vicinity of the magnetic field Hs.

Moreover, since this structure enables detecting current values ranging from a small current value, corresponding to in the vicinity of the magnetic field H=0, to a large current value, corresponding to in the vicinity of the magnetic field Hs, the electric cable to be detected 100 does not need to be wound around the core member 21 a number of times in order to improve the signal level of the current to be detected. As a result, the current sensor can be simplified and downsized, which widens the application of the sensor.

In the current sensor 1 according to the first embodiment, by canceling out the output signal itself and the displacement signal produced by shifting the phase of the output signal by a ½ cycle, the fundamental component, regularly increasing and decreasing, is removed from the signal component of the output signal, while a signal in which the harmonic component, irregularly increasing and decreasing in the form of distortion, is extracted. As a result, by extracting the signal in which the harmonic component is enhanced, the signal level of the signal to be detected can be specified.

In the first embodiment, since the harmonic component is outputted in the enhanced manner, based on the enhanced harmonic component, a corresponding relationship between the harmonic component and the signal level of the signal to be detected needs to be prepared.

In the current sensor 1 according to the second embodiment, the exciting coils 23 are respectively connected in series so as to have opposite phases whereas the detection coils 25 are respectively connected in series so as to have coordinate phases. Thus, the fundamental component, regularly increasing and decreasing from a flux generated by exciting signals, is canceled out, while the harmonic component, irregularly increasing and decreasing in the form of distortion, is outputted in the enhanced manner. It is to be noted that the same applies to a case wherein the exciting coils 23 are connected in series so as to have opposite phases, while the detection coil 25 is wound around the first and the second core member 21 in the combined manner to configure a single core member including the first and the second core member.

As a result, by extracting the output signal itself from the pair of detection coils 25 connected in series as the harmonic component, the signal level of the signal to be detected can be specified.

In the second embodiment, since the harmonic component is outputted in an enhanced manner, based on the enhanced harmonic component, a corresponding relationship between the harmonic component and the signal level of the signal to be detected needs to be prepared.

Moreover, in the current sensors 1 according to the third and the fourth embodiments, the external magnetic fields can be changed by the cancel signal through the first and second core member 21 respectively.

In these current sensors 1, canceling the change in the external magnetic field, which is caused by the signal to be detected, by feedback control of the cancel signal contributes to specify the signal level of the signal to be detected based on the signal component of the cancel signal used for the cancellation The cancel signal is outputted from the cancel coil wound around the same core member as where the detection coil is wound around, and influenced by the same external magnetic field and temperature environment as what influences the output signal from the detection coil. Therefore, canceling the change in the external magnetic field, which is caused due to the signal to be detected, by changing the signal level of the cancel signal means that the signal level corresponding to the signal level of the signal to be detected is reproduced by the cancel signal. This further indicates that the signal level of the cancel signal corresponds to the signal level of the signal to be detected.

By canceling the change in the external magnetic field, which is caused by the signal to be detected, with the canceling signal, the signal level of the cancel signal, used for canceling the change in the external magnetic field, can be handled as a signal component from which the influence of the permeability μ and the temperature environment are excluded, and as a signal component corresponding to the signal to be detected.

As a result, canceling the change in the external magnetic field, which is caused by the signal to be detected, by feedback control of the cancel signal contributes to specifying the signal level of the signal to be detected based on the signal component of the cancel signal used for the cancellation.

The invention claimed is:

1. A current sensor comprising a sensor element and a detector, the sensor element comprising:

at least one core member, annularly formed with a magnetic material, and having characteristics such that, corresponding to an external magnetic field that changes due to influence of a signal to be detected that passes through a detection area surrounded by the annularity, a permeability μ decreases from an vertex where the external magnetic field is 0, and such that curvature of a curve, exhibited when a change in the permeability μ is plotted in "a coordinate system defined by the external magnetic field—the permeability μ", becomes larger corresponding to absolute values of the external magnetic field;

at least one exciting coil wound around the at one core member so as to excite the at least one core member;

at least one detection coil wound around the at least one core member and used so as to detect the signal to be detected; and at least one cancel coil wound around the at least one core, and fed with a cancel signal so as to cancel out the change in the external magnetic field due to the influence of the signal to be detected, the sensor element being configured such that, while the at least one exciting coil is fed with an excitation signal, comprising a fundamental component, and when the signal to be detected flows, a signal, including a harmonic component, corresponding to the permeability μ of the at least one core member at that point, being superposed on the fundamental component, is outputted from the at least one detection coil, and the sensor element being further configured such that the change in the external magnetic field due to the influence of the cancel signal, fed to the at least one cancel coil, causes a change in the harmonic component superposed on the output signal from the at least one detection coil, and the detector comprising:

a component extraction unit that extracts, from the output signal of the at least one detection coil, the harmonic component superposed on the fundamental component among signal components included in the output signal;

a cancel control unit that controls feeding of the cancel signal to the at least one cancel coil;

a level specification unit that specifies a signal level corresponding to the harmonic component, extracted by the component extraction unit, as a signal level of the signal to be detected at that point based on a corresponding relationship between the harmonic component, potentially included in the output signal, and the signal level of the signal to be detected when the harmonic component is generated; and an information output unit that outputs information externally, indicating the signal level specified by the level specification unit, wherein the cancel control unit performs feedback control of a signal level of the cancel signal so that the harmonic component, extracted by the component extraction unit, becomes small, and wherein the level specification unit specifies the signal level in such a manner that, once the feedback control by the cancel control unit is initiated and when it is determined that the harmonic component extracted by the component extraction unit, is smaller than a predetermined threshold, based on a corresponding relationship between the harmonic component canceled out according to the signal level of the cancel signal and the signal level of the signal to be detected when the harmonic component is generated, the level specification unit specifies the signal level corresponding to the signal level of the cancel signal that initially makes the harmonic component smaller than the threshold as the signal level of the signal to be detected at that point.

2. The current sensor according to claim 1, wherein the at least one core member in the sensor element comprises a first core member and a second core member, each disposed along a direction penetrating the detection area, wherein the at least one exciting coil in the sensor element comprises a first exciting coil and a second exciting coil connected in series, the first exciting coil being wound around the first core member, the second exciting coil being wound around the second core member, and a number of windings and a positional relationship of each of the first exciting coil and the second exciting coil being determined such that a signal flowing in the first exciting coil and a signal flowing in the second exciting coil have opposite phases and equivalent signal levels, wherein the at least one detection coil in the sensor element comprises a first detection coil and a second detection coil connected in series, the first detection coil being wound around the first core member, the second detection coil being wound around the second core member, and a number of windings and a positional relationship of each of the first detection coil and the second detection coil being determined such that a signal flowing in the first detection coil and a signal flowing in the second detection coil have coordinate phases and equivalent signal levels, wherein the component extraction unit in the detector extracts an output signal flowing through and out of the first detection coil and the second detection coil as the harmonic component, and wherein the at least one cancel coil in the sensor element comprises a first cancel coil and a second cancel coil connected in series, the first cancel coil being wound around the first core member, the second cancel coil being wound around the second core member, and a number of windings and a positional relationship of each of the first cancel coil and the second cancel coil being determined such that a signal flowing in the first cancel coil and a signal flowing in the second cancel coil have coordinate phases and equivalent signal levels.

3. The current sensor according to claim 1, wherein the at least one core member in the sensor element comprises a first core member and a second core member, each disposed along a direction penetrating the detection area, wherein the at least one exciting coil comprises a first exciting coil and a second exciting coil connected in series, the first exciting coil being wound around the first core member, the second exciting coil being wound around the second core member, a number of windings and a positional relationship of each of the first exciting coil and the second exciting coil being determined such that a signal flowing in the first exciting coil and a signal flowing in the second exciting coil have opposite phases and equivalent signal levels, wherein the at least one detection coil comprises a first detection coil and a second detection coil connected in series, the first detection coil being wound around the first core member, the second detection coil being wound around the second core member, and a number of windings and a positional relationship of each of the first detection coil and the second detection coil being determined such that a signal flowing in the first detection coil and a signal flowing in the second detection coil have coordinate phases and equivalent signal levels, wherein the component extraction unit in the detector extracts an output signal flowing through and out of the first detection coil and the second detection coil as the harmonic component, and wherein the at least one cancel coil in the sensor element comprises a single cancel coil wound around both the first core member and the second core member.

4. The current sensor according to claim 1, wherein the at least one core member in the sensor element comprises a first core member and a second core member, each disposed along a direction penetrating the detection area, wherein the at least one exciting coil comprises a first exciting coil and a second exciting coil connected in series, the first exciting coil being wound around the first core member, the second exciting coil being wound around the second core member, and a number of windings and a positional relationship of each of the first exciting coil and the second exciting coil being determined such that a signal flowing in the first exciting coil and a signal flowing in the second exciting coil have opposite phases and equivalent signal levels, wherein the at least one detection coil in the sensor element comprises a single detection coil wound around both the first core member and the second core member, wherein the component extraction unit in the detector extracts an output signal flowing through and out of the single detection coil as the harmonic component, and wherein the at least one cancel coil in the sensor element comprises a first cancel coil and a second cancel coil connected in series, the first cancel coil being wound around the first core member, the second cancel coil being wound around the second core member, and a number of windings and a positional relationship of each of the first cancel coil and the second cancel coil being determined such that a signal flowing in the first cancel coil and a signal flowing in the second cancel coil have coordinate phases and equivalent signal levels.

5. The current sensor according to claim 1, wherein the at least one core member in the sensor element comprises a first core b r and a second core member, each disposed along a direction penetrating the detection area, wherein the at least one exciting coil in the sensor element comprises a first exciting coil and a second exciting coil connected in series, the first exciting coil being wound around the first core member, the second exciting coil being wound around the second core member, and a number of windings and a positional relationship of each of the first exciting coil and the second exciting coil being determined such that a signal flowing in the first exciting coil and a signal flowing in the second exciting coil have opposite phases and equivalent signal levels, wherein the at least one detection coil in the sensor element comprises a single detection coil wound around both the first core member and the second core member, wherein the component extraction unit in the detector extracts an output signal flowing through and out of the single detection coil as the harmonic component, and wherein the at least one cancel coil in the sensor element comprises a single cancel coil wound around both the first core member and the second core member.

6. The current sensor according to claim 1, wherein the sensor element comprises a displacement generation unit that produces a displacement signal based on the output signal from the at least one detection coil, the displacement signal being produced by shifting a phase of the output signal by a ½ cycle, and wherein the component extraction unit in the detector extracts a signal, generated by combining the output signal from the at least one detection coil and the displacement signal produced by the displacement generation unit, as the harmonic component.

7. A sensor element comprising:

at least one core member, annularly formed with a magnetic material, and having characteristics such that, corresponding to an external magnetic field that changes due to influence of a signal to be detected that passes through a detection area surrounded by the annularity, a permeability $\mu$ decreases from an vertex where the external magnetic field is 0, and such that curvature of a curve, exhibited when a change in the permeability $\mu$ is plotted in "a coordinate system defined by the external magnetic field—the permeability $\mu$", becomes larger corresponding to absolute values of the external magnetic field;

at least one exciting coil wound around the at least one core member so as to excite the at least one core member;

at least one detection coil wound around the at least one core member and used so as to detect the signal to be detected; and at least one cancel coil wound around the at least one core member, and fed with a cancel signal so as to cancel out the change in the external magnetic field due to the influence of the signal to be detected, the sensor element being configured such that, while the at least one exciting coil is fed with an excitation signal, comprising a fundamental component, and when the signal to be detected flows, a signal, including a harmonic component, corresponding to the permeability $\mu$ of the at least one core member at that point, being superposed on the fundamental component, is outputted from the at least one detection coil, and the sensor element being further configured such that the change in the external magnetic field due to the influence of the cancel signal, fed to the at least one cancel coil, causes a change in the harmonic component superposed on the output signal from the at least one detection coil.

8. A control device configured to be connected to a current sensor comprising at least one detection coil and at least one cancel coil, and the control device comprising:

a component extraction unit that extracts, from an output signal of the at least one detection coil, a harmonic component superposed on a fundamental component among signal components included in the output signal;

a cancel control unit that controls feeding of a cancel signal to the at least one cancel coil, the cancel signal being a signal for the at least one cancel coil to cancel out a change in an external magnetic field due to an influence of a signal to be detected;

a level specification unit that specifies a signal level corresponding to the harmonic component, extracted by the component extraction unit, as a signal level of a signal to be detected at that point based on a relationship between the harmonic component, potentially included in the output signal, and the signal level of the signal to be detected when the harmonic component is generated; and an information output unit that outputs information externally, indicating the signal level specified by the level specification unit, wherein the cancel control unit performs feedback control of the signal level of the cancel signal so that the harmonic component, extracted by the component extraction unit, becomes small, and wherein the level specification unit specifies the signal level in such a manner that, once the feedback control by the cancel control unit is initiated and when it is determined that the harmonic component, extracted by the component extraction unit, is smaller than a predetermined threshold, based on a corresponding relationship between the harmonic component canceled out according to the signal level of the cancel signal and the signal level of the signal to be detected when the harmonic component is generated, the level specification unit specifies the signal level corresponding to the signal level of the cancel signal that initially makes the harmonic component smaller than the threshold as the signal level of the signal to be detected at that point.

* * * * *